United States Patent [19]
Watanabe et al.

[11] Patent Number: 6,005,217
[45] Date of Patent: *Dec. 21, 1999

[54] MICROWAVE PLASMA PROCESSING METHOD FOR PREVENTING THE PRODUCTION OF ETCH RESIDUE

[75] Inventors: Katsuya Watanabe; Takashi Sato, both of Kudamatsu; Eri Haikatak, Fuchu, all of Japan

[73] Assignee: Hitachi, Ltd., Tokyo, Japan

[ * ] Notice: This patent is subject to a terminal disclaimer.

[21] Appl. No.: 09/149,452

[22] Filed: Sep. 9, 1998

Related U.S. Application Data

[63] Continuation of application No. 08/492,887, Jun. 20, 1995.

[30] Foreign Application Priority Data

Jun. 20, 1994 [JP] Japan ...................................... 6-136895

[51] Int. Cl.$^6$ ............................ B23K 10/00; H01L 21/00
[52] U.S. Cl. ............................... 219/121.43; 219/121.44; 156/646.1; 204/298.31; 204/298.37
[58] Field of Search ........................... 219/121.4, 121.41, 219/121.43, 121.44; 156/643.1, 646.1, 345; 204/298.02, 298.37, 298.38, 298.31

[56] References Cited

U.S. PATENT DOCUMENTS 5,213,658   5/1993   Ishida ........................................ 156/643
5,266,154  11/1993   Tatsumi ..................................... 156/643

*Primary Examiner*—Mark Paschall
*Attorney, Agent, or Firm*—Antonelli, Terry, Stout & Kraus, LLP

[57] ABSTRACT

A microwave plasma processing method capable of processing an object layer having a minute configuration and a laminated object layer without producing any etch residue and of increasing the ratio of the etching selectivity of the object layer to those of a mask and an underlying layer when etching a laminated film. To achieve this, the intensity of a magnetic field created by solenoids surrounding a plasma processing chamber is varied to vary the distance between the object surface of a workpiece and a flat resonance region for etching an object layer and for overetching the object layer to vary the position of a plasma produced by the interaction of an electric field created by a microwave and the magnetic field created by the solenoids according to the layers being processed.

7 Claims, 2 Drawing Sheets

MICROWAVE PLASMA PROCESSING METHOD FOR PREVENTING THE PRODUCTION OF ETCH RESIDUE

This is a continuation of application Ser. No. 08/492,887, filed Jun. 20, 1995 now pending.

BACKGROUND OF THE INVENTION

The present invention relates to a microwave plasma processing method and, more particularly, to a microwave plasma processing method using an ECR discharge.

A prior microwave plasma processing method, such as a method disclosed in Japanese Patent Laid-open (Kokai) No. 60-154620, creates a magnetic field within a gas-filled discharge tube using a solenoid, introduces a microwave into the discharge tube to produce a plasma within the discharge tube by the interactions of the magnetic field and the microwave, and processes a workpiece with the plasma. When processing a workpiece with a plasma, this prior microwave processing method varies the amplitude of the current flowing through the splenoid to vary the magnetic flux density of the magnetic field in order that a maximum plasma density region in the plasma density distribution oscillates between a central region and the peripheral region of the object surface of the workpiece to apply a plasma of a substantially uniform plasma density distribution to the object surface of the workpiece, thereby improving the uniformity of processing.

However, this publication No. 60-154620 teaches nothing about the etch selectivity between the mask of the workpiece and an underlying layer, the production of etch residue, a laminated film for the enhancement of the reliability of metal wiring lines and the like. In this prior method, the density distribution of a plasma moves to the central portion or the peripheral portion of the object surface according to the gradient of the magnetic field and the method is not devised for the optimization of the plasma when the workpiece is changed. Therefore, it is difficult to determine process conditions capable of improving the etch selectivity between the mask and the underlying layer and to enable a processing without producing etch residue, when the prior art is applied to processing a workpiece having a minute configuration or to processing a laminated workpiece.

SUMMARY OF THE INVENTION

Accordingly, it is an object of the present invention to provide a microwave plasma processing method capable of etching a workpiece having a minute configuration, or a laminated workpiece, with a high etch selectivity between a mask and an underlying layer.

The object of the invocation is achieved by a microwave plasma processing method that produces a plasma by exerting the actions of an electric field created by a microwave and a magnetic field created by a solenoid on a processing gas and processes a workpiece provided with a plurality of films of different materials with the plasma, and involves the step controlling the magnetic field created by the solenoid so as to vary the distance between the surface of the workpiece to be processed and a resonance region according to the types of the films processed on the workpiece, so that the position of the plasma produced by the action of the electric field created by the microwave and the magnetic field created by the solenoid varies accordingly.

The etch selectivity between the film to be processed and the mask can be increased by controlling a magnetic field created by the solenoid to form a resonance region in which the magnetic field and an electric field created by the microwave resonate with each other and by varying the distance between the flat resonance region and the surface of the workpiece according to the type of film to be processed so that the position of a plasma produced by the action of the electric field created by the microwave and the magnetic field created by the solenoid is varied according to the type of the film to be processed. When etching the workpiece, the distance between the surface of the workpiece to be processed of the workpiece and the plasma is increased to prevent production of an etch residue which is liable to be produced when the workpiece is etched, and the distance between the surface of the workpiece to be processed and the plasma is reduced when overetching the surface, to enable etching of the surface, while suppressing the etching rate at which the underlying layer is etched.

DESCRIPTION OF THE PREFERRED EMBODIMENTS

A microwave plasma processing method in a preferred embodiment according to the present invention will be described with reference to FIGS. 1 and 2.

Figure 1:
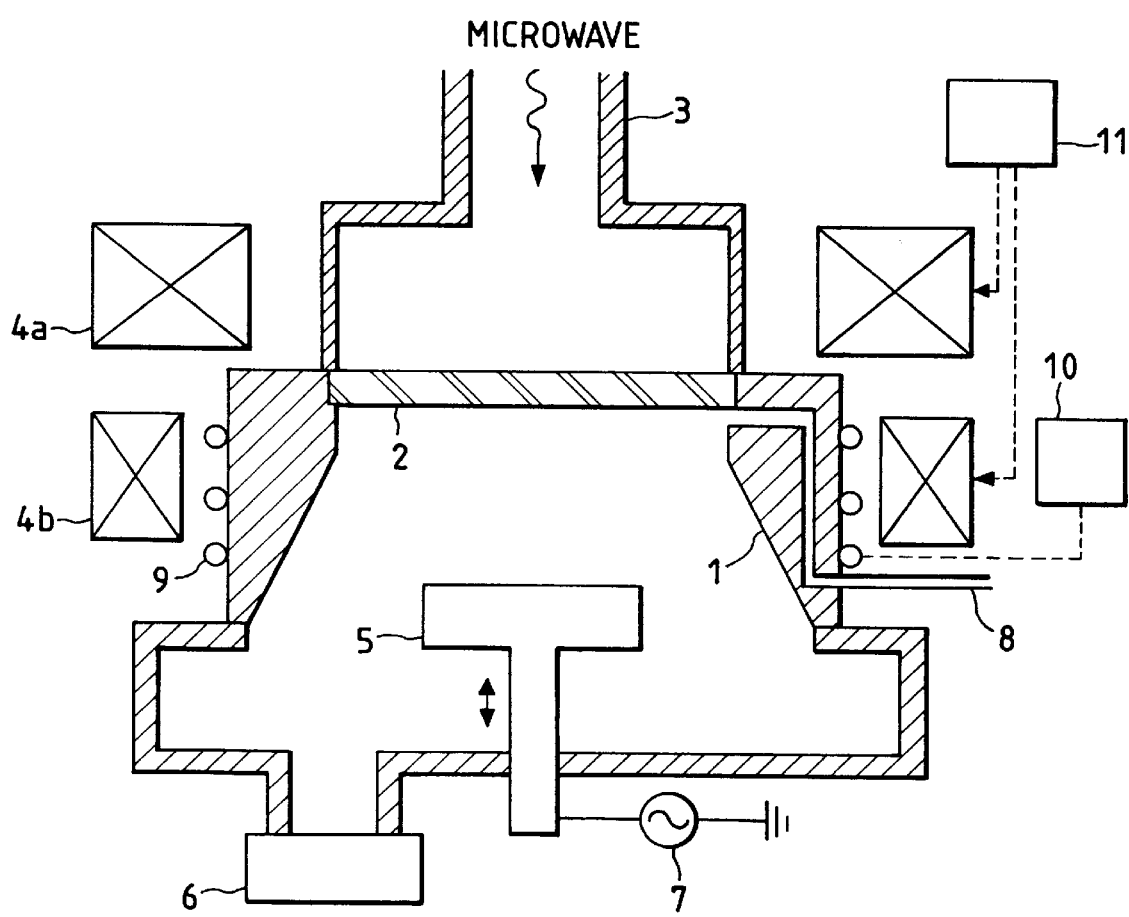
FIG. 1 is a schematic sectional view of a microwave plasma etching apparatus for carrying out a microwave plasma processing method in a preferred embodiment of the present invention.

FIG. 1 shows, by way of example, a microwave plasma processing apparatus, such as an etching apparatus, for carrying out the present invention. The microwave plasma processing apparatus has a plasma processing vessel defining a plasma processing chamber 1, a quartz microwave inlet window 2 fitted in an opening formed in the upper wall of the plasma processing chamber 1, a waveguide 3 for guiding a microwave generated by a microwave oscillator, not shown, into the plasma processing chamber 1, solenoids 4a and 4b for creating a magnetic field in the plasma processing chamber 1, a stage 5 for supporting a workpiece on its top surface, a vacuum pump 6 for evacuating the plasma processing chamber 1, a high-frequency power source 7 for applying a bias voltage to the stage 5, and a gas supply line 8 through which an etching gas is supplied into the plasma processing chamber 1.

The plasma processing chamber 1 has a discharge space gradually expanding from the microwave inlet window 2 toward the stage 5. The solenoid 4a is disposed on a level above the plasma processing chamber 1, and the solenoid 4b is disposed on a level corresponding to the discharge space of the plasma processing chamber 1. The solenoid 4a has an outside diameter equal to that of the solenoid 4b and an inside diameter smaller than that of the solenoid 4b, and hence the intensity of a magnetic field created by the solenoid 4a is higher than that of a magnetic field created by the solenoid 4b. The use of the solenoids 4a and 4b in combination creates a magnetic field having a flat resonant magnetic field distribution meeting ECR conditions. Currents controlled by a power controller 11 are supplied to the solenoids 4a and 4b, respectively. The currents are controlled so that the magnetic flux density of the magnetic field is in the range of 2000 to 1200 G. An electric heater 9 is wound around the side wall of the plasma processing chamber 1 to heat the side wall of the plasma processing chamber 1. A current regulated by a power regulator 10 is supplied to the electric heater 9.

A microwave of 2.45 GHz in this embodiment, generated by the microwave oscillator, propagates through the waveguide 3 and the microwave inlet window 2 into the plasma processing chamber 1, and an etching gas supplied into the plasma processing chamber 1 is ionized by the interaction of the microwave and the high-intensity magnetic field created by the solenoids 4a and 4b to produce a high-density plasma around an ECR plane. The energy of ions of the plasma falling on the workpiece mounted on the stage 5 is controlled, independently of the production of the plasma, by the high-frequency power source 7 connected to the stage 5. The position of the plasma relative to the top surface of the stage 5 within the plasma processing chamber 1 can be, varied by varying the magnetic .field intensity gradient through the control of the currents flowing through the solenoids 4a and 4b by the power controller 11.

Figure 2:
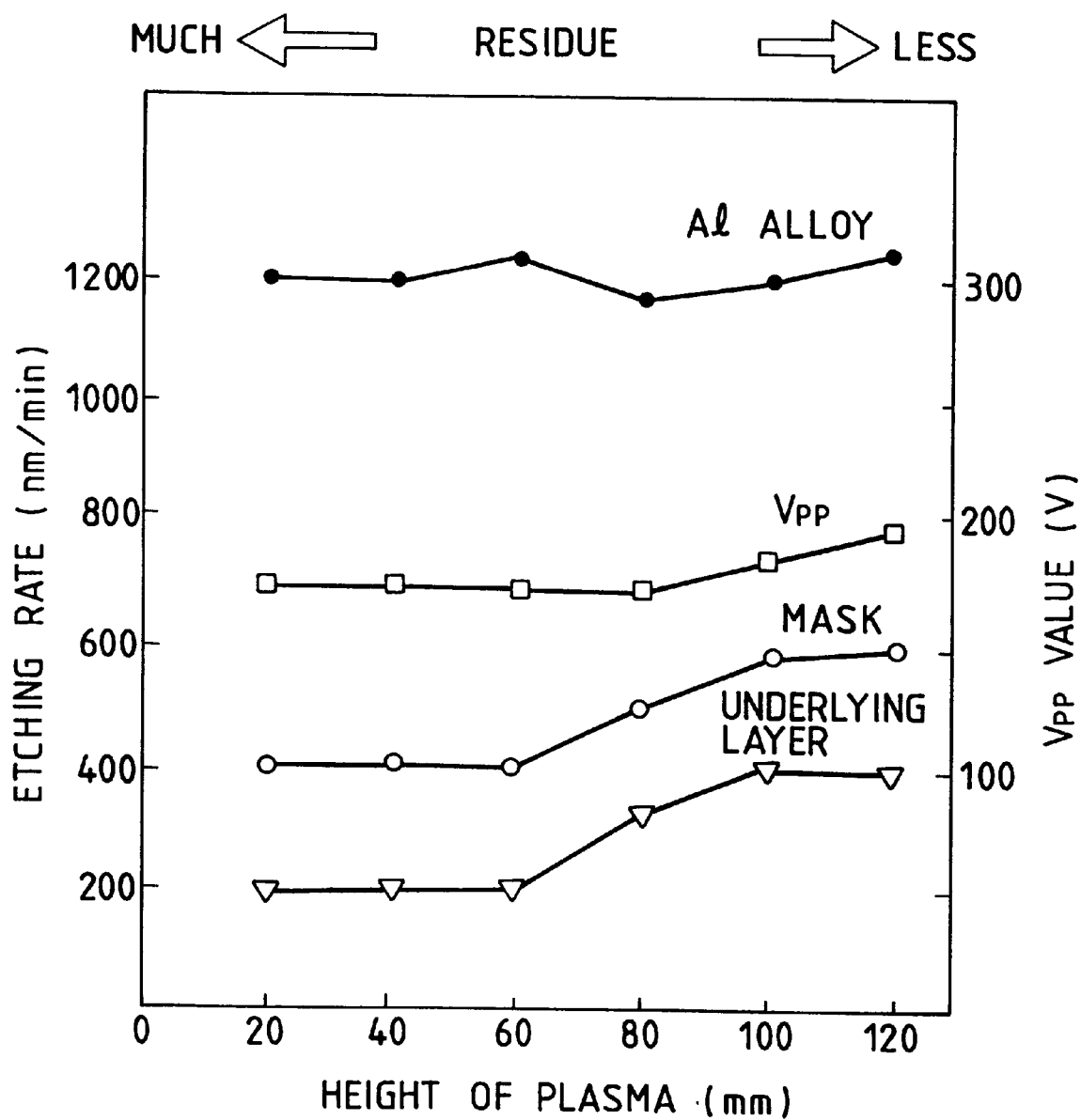
FIG. 2 is a graph showing the relation between etching rates and the height of a plasma from the top surface of a stage and the relation between the peak-to-peak voltage Vpp of a voltage applied to the stage and the height of the plasma.

FIG. 2 shows the dependence of the etching rates of a mask and the underlying layer, and of the peak-to-peak RF voltage Vpp, on the height of the plasma from the top surface of the stage 5, which can be varied by controlling the currents flowing through the solenoids 4a and 4b, as determined through experiments. In this experiments, the underlying layer was the oxide film, an object layer was an Al alloy film, the mask was a photoresist mask, the etching gas, namely, a mixture of BC13 and C12, was supplied at 150 sccm, the pressure in the plasma processing chamber 1 was maintained at 12 mtorr, microwave power was about 1000 W and high-frequency power was 85 W. As is obvious from the experimental results shown in FIG. 2, the etching rates of the mask and the underlying layer increase while the etching rate of the object layer of the workpiece does not vary significantly as the height of the plasma increases. The peak-to-peak voltage Vpp of the voltage applied to the stage 5 increases with the increase of the height of the plasma; that is, the bias voltage increases and the energy of the incident ions of the plasma increases to reduce the etch residue during the etching process.

When the object layer is an Al alloy layer, the height of the plasma is determined so that no etch residue is produced, i.e., the height of the plasma from the top surface of the stage 5 is increased, for etching the Al alloy layer, and the height of the plasma is determined so that the etching selectivity of the underlying layer is high, i.e., the height of the plasma from the top surface of the stage 5 is reduced, for overetching.

Although the microwave plasma processing method has been described as with reference to etching a workpiece having an object layer of an Al alloy, effective etching conditions can be determined for etching an object layer of a material other than Al alloy by taking into consideration the etching characteristics as shown in FIG. 2 for the material forming the object layer.

When etching a workpiece having a laminated film fabricated by forming an Al alloy film over a TiN film or a TiW film formed on a SiO2 film, as an underlying layer, and having a photoresist mask, a mixture of BC13 and C12 is for example, used as an etching gas and the height of the plasma is increased so that no etch residue is produced while etching the Al alloy film, while the height of the plasma is reduced to increase the ratio between the respective etching selectivity of the photoresist mask and the underlying layer, when etching the TiN film or the TiW film. Although the height of the plasma is reduced for etching the Al alloy film, and the height of the plasma is reduced for etching the TiN film or TiW film in this example, since conditions for the height of the plasma are dependent on the mixing ratio of the etching gas, pressure and such, the aforesaid etching conditions do not apply in all cases.

As is apparent from the foregoing description, in this embodiment, the distance between the flat resonance region, in which the electric field created by the microwave resonates with the magnetic field created by the solenoids 4a and 4b, and the object surface of the workpiece is varied according to the type of the film being etched of the workpiece by controlling the magnetic field created by the solenoids 4a and 4b so that the position of the plasma produced by the interaction of the electric field created by the microwave and the magnetic field created by the solenoids 4a and 4b is varied to prevent the production of an etch residue, which is liable to be produced when etching the workpiece, and to make possible the overetching of object layer, while the underlying layer is etched at a reduced etching rate. Although the position of the plasma is varied by controlling the magnetic field created by the solenoid coils in this embodiment, the stage may be moved to vary the position of the plasma relative to the stage for the same effect.

The present invention is capable of processing an object layer having a minute configuration, laminated layers and various types of films without producing an etch residue, and is capable of selectively increasing the ratio of the etching of the object layer to that of the underlying layer when overetching the object layer.

What is claimed is:

1. A plasma processing method comprising the steps of: producing a high-density plasma on a processing gas; controlling an energy of ions of said high-density plasma falling on a workpiece mounted on a stage by a high-frequency power source connected to said stage; processing a workpiece having a laminated film provided with different types of films including a metal layer to be processed with the plasma in the same plasma processing chamber; and, during the processing of said workpiece, varying the distance between a surface of the workpiece to be processed and said high-density plasma according to the types of the films of the workpiece being processed.

2. A plasma processing method according to claim 1, wherein said different types of films are processed by the same processing gas.

3. A plasma processing method according to claim 1, wherein said laminated film comprises an Al alloy film provided over a TiN film or a TiW film, and wherein, during the processing of said workpiece, the distance between the surface of the workpiece and said high density plasma is reduced when processing the Al alloy film and the distance is increased when processing the TiN or TiW film.

4. A workpiece processed by the method of claim 1.

5. A workpiece processed by the method of claim 3.

6. A workpiece processed by the method of claim 3.

7. A workpiece comprising a substrate, a patterned TiN or TiW film provided over the substrate, and a patterned Al alloy film provided over the patterned TiN or TiW film, wherein the workpiece has been processed by the method of claim 3.

* * * * *